United States Patent
Sul et al.

(10) Patent No.: US 9,540,549 B2
(45) Date of Patent: Jan. 10, 2017

(54) ANISOTROPIC CONDUCTIVE FILM AND SEMICONDUCTOR DEVICE BONDED BY THE SAME

(71) Applicants: Kyung Il Sul, Uiwang-si (KR); Dong Seon Uh, Uiwang-si (KR); Nam Ju Kim, Uiwang-si (KR); Kyoung Soo Park, Uiwang-si (KR); Young Woo Park, Uiwang-si (KR); Joon Mo Seo, Uiwang-si (KR); Arum Yu, Uiwang-si (KR); Hyun Min Choi, Uiwang-si (KR)

(72) Inventors: Kyung Il Sul, Uiwang-si (KR); Dong Seon Uh, Uiwang-si (KR); Nam Ju Kim, Uiwang-si (KR); Kyoung Soo Park, Uiwang-si (KR); Young Woo Park, Uiwang-si (KR); Joon Mo Seo, Uiwang-si (KR); Arum Yu, Uiwang-si (KR); Hyun Min Choi, Uiwang-si (KR)

(73) Assignee: CHEIL INDUSTRIES, INC., Gumi-Si, Kyeongsangbuk-Do (KR)

( * ) Notice: Subject to any disclaimer, the term of this patent is extended or adjusted under 35 U.S.C. 154(b) by 614 days.

(21) Appl. No.: 13/718,104

(22) Filed: Dec. 18, 2012

(65) Prior Publication Data
US 2013/0154129 A1  Jun. 20, 2013

(30) Foreign Application Priority Data
Dec. 19, 2011 (KR) ........................ 10-2011-0136957

(51) Int. Cl.
*H01B 1/20* (2006.01)
*C09D 5/24* (2006.01)
*C09J 9/00* (2006.01)
*H01L 23/00* (2006.01)
*C09J 163/00* (2006.01)
*C09J 9/02* (2006.01)
*H01L 23/29* (2006.01)
*C08G 59/22* (2006.01)
*C08G 59/24* (2006.01)
*C08G 59/68* (2006.01)
*C08L 63/00* (2006.01)

(52) U.S. Cl.
CPC ............ *C09J 163/00* (2013.01); *C08G 59/226* (2013.01); *C08G 59/24* (2013.01); *C08G 59/687* (2013.01); *C08L 63/00* (2013.01); *C09D 5/24* (2013.01); *C09J 9/02* (2013.01); *H01B 1/20* (2013.01); *H01L 23/29* (2013.01); *H01L 24/29* (2013.01); *C08L 2205/02* (2013.01); *H01L 2224/293* (2013.01); *H01L 2224/2929* (2013.01); *H01L 2224/29298* (2013.01); *H01L 2924/07802* (2013.01); *H01L 2924/07811* (2013.01); *H01L 2924/15788* (2013.01)

(58) Field of Classification Search
CPC ............... H01B 1/00; H01B 1/20; C09D 5/24; C09J 9/02
See application file for complete search history.

(56) References Cited

U.S. PATENT DOCUMENTS 6,918,984 B2 * 7/2005 Murray et al. ............. 156/275.5
7,053,133 B2 * 5/2006 Yamaguchi et al. ............ 522/84
2011/0120767 A1 * 5/2011 Sato et al. .................. 174/84 R

FOREIGN PATENT DOCUMENTS

| JP | 2011-252139 A | | 12/2011 | |
|---|---|---|---|---|
| KR | 10-2005-0022018 A | | 3/2005 | |
| KR | 10-2011-0074320 A | | 6/2011 | |
| WO | WO 2011/075553 | * | 6/2011 | ........... C07C 381/12 |

* cited by examiner

*Primary Examiner* — Mark Kopec
(74) *Attorney, Agent, or Firm* — Lee & Morse, P.C.

(57) ABSTRACT

A semiconductor device bonded by an anisotropic conductive film and an anisotropic conductive film composition, the anisotropic conductive film including a reactive monomer having an epoxy equivalent weight of about 120 to about 180 g/eq; a hydrogenated epoxy resin; and a sulfonium cation curing catalyst.

16 Claims, No Drawings

ANISOTROPIC CONDUCTIVE FILM AND SEMICONDUCTOR DEVICE BONDED BY THE SAME

CROSS-REFERENCE TO RELATED APPLICATION

Korean Patent Application No. 10-2011-0136957, filed on Dec. 19, 2011, in the Korean Intellectual Property Office, and entitled: "ANISOTROPIC CONDUCTIVE FILM AND SEMICONDUCTOR DEVICE BONDED BY THE SAME," is incorporated by reference herein in its entirety.

BACKGROUND

1. Field

Embodiments relate to an anisotropic conductive film and a semiconductor device bonded by the same.

2. Description of the Related Art

Generally, anisotropic conductive films (ACFs) refer to film-like adhesives in which conductive particles, e.g., metal particles including nickel or gold particles or metal-coated polymer particles, are dispersed in a resin, e.g., an epoxy resin. Anisotropic conductive films may denote polymer layers having electric anisotropy and adhesive properties, and which exhibit conductive properties in a thickness direction of the films and insulating properties in a surface direction thereof. When an anisotropic conductive film is disposed between circuit boards to be connected and subjected to heating and pressing under particular conditions, circuit terminals of the circuit boards may be electrically connected through conductive particles, and an insulating adhesive resin may be filled in spaces between adjacent circuit terminals to make the conductive particles independent from each other, thereby achieving high lateral insulation performance between the circuit terminals.

SUMMARY

Embodiments are directed to an anisotropic conductive film and a semiconductor device bonded by the same.

The embodiments may be realized by providing a semiconductor device bonded by an anisotropic conductive film, the anisotropic conductive film including a reactive monomer having an epoxy equivalent weight of about 120 to about 180 g/eq; a hydrogenated epoxy resin; and a sulfonium cation curing catalyst.

The anisotropic conductive film may include about 1 to about 20 parts by weight of the reactive monomer having an epoxy equivalent weight of about 120 to about 180 g/eq; about 5 to about 50 parts by weight of the hydrogenated epoxy resin; and about 0.1 to about 10 parts by weight of the sulfonium cation curing catalyst, all parts by weight being based on 100 parts by weight of the anisotropic conductive film in terms of solid content.

The anisotropic conductive film may further include a binder resin and conductive particles.

The binder resin may include at least one selected from the group of a polyimide resin, a polyamide resin, a phenoxy resin, an epoxy resin, a polymethacrylate resin, a polyacrylate resin, a polyurethane resin, an acrylate modified urethane resin, a polyester resin, a polyester urethane resin, a polyvinyl butyral resin, a styrene-butylene-styrene resin and epoxy modifications thereof, a styrene-ethylene-butylene-styrene resin and modifications thereof, and acrylonitrile butadiene rubber and hydrogenated compounds thereof.

The anisotropic conductive film may include about 1 to about 20 parts by weight of the reactive monomer having an epoxy equivalent weight of about 120 to about 180 g/eq; about 5 to about 50 parts by weight of the hydrogenated epoxy resin; about 0.1 to about 10 parts by weight of the sulfonium cation curing catalyst; about 20 to about 60 parts by weight of the binder resin; and about 0.1 to about 30 parts by weight of the conductive particles, all parts by weight being based on 100 parts by weight of the anisotropic conductive film in terms of solid content.

The hydrogenated epoxy resin may have an epoxy equivalent weight of about 150 to about 1,300 g/eq.

The hydrogenated epoxy resin may include a hydrogenated bisphenol A epoxy resin.

The hydrogenated bisphenol A epoxy resin may include at least one selected from the group of a hydrogenated bisphenol A epoxy monomer represented by Formula 2, below, or a hydrogenated bisphenol A epoxy oligomer represented by Formula 3, below,

[Formula 2]

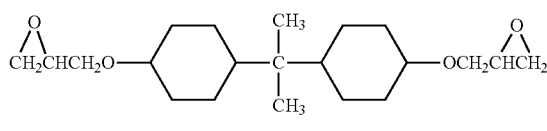

[Formula 3]

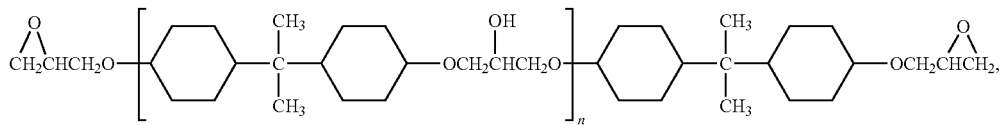

wherein, in Formula 3, n is an integer of about 1 to about 13.

The reactive monomer may include at least one selected from the group of a reactive monomer having at least two glycidyl groups, a reactive monomer having a monoaromatic structure, and a reactive monomer having an alicyclic structure.

The reactive monomer may include at least one selected from the group of resorcinol diglycidyl ether, 1,4-cyclohexane dimethanol diglycidyl ether, dicyclopentadiene dioxide, 2-((4-(2-oxiranylmethoxy)phenoxy)methyl)oxirane, diglycidyl 1,2-cyclohexanedicarboxylate, diglycidyl terephthalate, and diglycidyl o-phthalate.

The sulfonium cation curing catalyst may include sulfonium borate.

The sulfonium borate may include a compound represented by Formula 1:

[Formula 1]

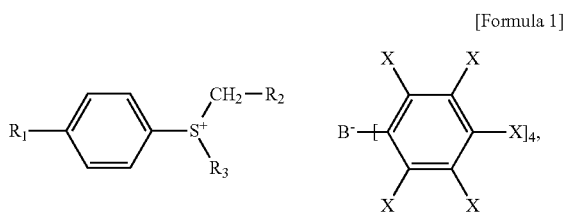

wherein $R_1$ is selected from the group of hydrogen, a methyl group, an ethyl group,

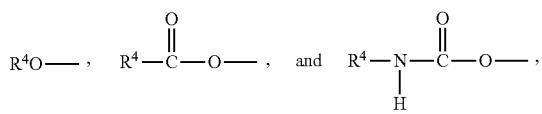

$R^4$ being selected from the group of an aromatic hydrocarbon, a substituted aromatic hydrocarbon, an aliphatic hydrocarbon, a substituted aliphatic hydrocarbon, a carboxyl group, and a sulfonyl group; $R_2$ may be selected from the group of toluene, phenol, benzene, o-xylene, and substituted or unsubstituted naphthalene; $R_3$ may be selected from the group of a methyl group, an ethyl group, a propyl group, and a butyl group; and X may be fluorine.

$R_2$ may be methylnaphthalene or dimethylnaphthalene.

The embodiments may also be realized by providing a semiconductor device bonded by a rapid low-temperature curable anisotropic conductive film, the rapid low-temperature curable anisotropic conductive film including a reactive monomer having an epoxy equivalent weight of about 120 to about 180 g/eq, and a sulfonium cation curing catalyst, wherein the rapid low-temperature curable anisotropic conductive film has a curing rate of about 80% or more when cured at 150 to 170° C. for 5 seconds.

The rapid low-temperature curable anisotropic conductive film may further include a hydrogenated epoxy resin.

The reactive monomer may include at least one selected from the group of a reactive monomer having at least two glycidyl groups, a reactive monomer having a monoaromatic structure, and a reactive monomer having an alicyclic structure.

The reactive monomer may include at least one selected from the group of resorcinol diglycidyl ether, 1,4-cyclohexane dimethanol diglycidyl ether, dicyclopentadiene dioxide, 2-((4-(2-oxiranylmethoxy)phenoxy)methyl)oxirane, diglycidyl 1,2-cyclohexanedicarboxylate, diglycidyl terephthalate, and diglycidyl o-phthalate.

The embodiments may also be realized by providing an anisotropic conductive film composition, including a reactive monomer having an epoxy equivalent weight of about 120 to about 180 g/eq; a hydrogenated epoxy resin; and a sulfonium cation curing catalyst.

DETAILED DESCRIPTION

Example embodiments will now be described more fully hereinafter; however, they may be embodied in different forms and should not be construed as limited to the embodiments set forth herein. Rather, these embodiments are provided so that this disclosure will be thorough and complete, and will fully convey exemplary implementations to those skilled in the art.

It will also be understood that when a layer or element is referred to as being "on" another element, it can be directly on the other element, or intervening elements may also be present. In addition, it will also be understood that when an element is referred to as being "between" two elements, it can be the only element between the two elements, or one or more intervening elements may also be present.

An embodiment provides a semiconductor device bonded by an anisotropic conductive film. The anisotropic conductive film may include, e.g., (a) a reactive monomer having an epoxy equivalent weight of about 120 to about 180 g/eq; (b) a hydrogenated epoxy resin; and (c) a sulfonium cation curing catalyst.

(a) Reactive Monomer Having Epoxy Equivalent Weight of about 120 to about 180 g/eq The reactive monomer may include any suitable reactive monomer that has an epoxy equivalent weight of about 120 to about 180 g/eq, without being particularly limited.

Examples of reactive monomers having an epoxy equivalent weight of about 120 to about 180 g/eq may include resorcinol diglycidyl ether, 1,4-cyclohexane dimethanol diglycidyl ether, dicyclopentadiene dioxide, 2-((4-(2-oxiranylmethoxy)phenoxy)methyl)oxirane, diglycidyl 1,2-cyclohexanedicarboxylate, diglycidyl terephthalate, and diglycidyl o-phthalate, without being limited thereto. The monomers may be used alone or in combination thereof.

The reactive monomer having an epoxy equivalent weight of about 120 to about 180 g/eq may help reduce and/or prevent an excessive increase or decrease in curing rate at low temperature and may help facilitate rapid low-temperature curing at a properly adjusted rate.

The reactive monomer having an epoxy equivalent weight of about 120 to about 180 g/eq may be present in the ACF in an amount of about 1 to about 20 parts by weight, e.g., about 1 to about 10 parts by weight, based on 100 parts by weight of the anisotropic conductive film in terms of solid content. Within this range, rapid low-temperature curing of the anisotropic conductive film may be effectively achieved.

(b) Hydrogenated Epoxy Resin

The hydrogenated epoxy resin may include any suitable hydrogenated epoxy resin, without being particularly limited.

In an implementation, the hydrogenated epoxy resin may have an epoxy equivalent weight of, e.g., about 180 to about 1,300 g/eq.

In an implementation, the hydrogenated epoxy resin may include, e.g., a hydrogenated bisphenol A epoxy resin.

In an implementation, the hydrogenated epoxy resin may include, e.g., a hydrogenated bisphenol A epoxy monomer represented by Formula 2 or a hydrogenated bisphenol A epoxy oligomer represented by Formula 3.

[Formula 2]

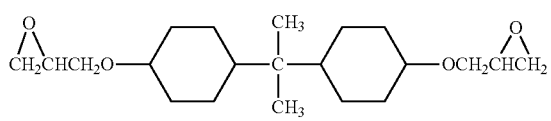

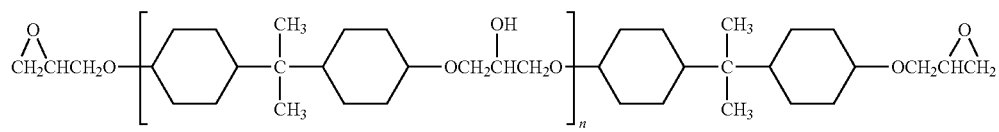

In Formula 3, n may be an integer of about 1 to about 13.

The hydrogenated bisphenol A epoxy monomer represented by Formula 2 or the hydrogenated bisphenol A epoxy oligomer represented by Formula 3 may form a dense structure (as compared with general bisphenol A epoxy), which may be remarkably hard. Further, the hydrogenated bisphenol A epoxy monomer or the hydrogenated bisphenol A epoxy oligomer according to an embodiment may have a linear structure and thus may exhibit even harder properties. Accordingly, the anisotropic conductive film may exhibit excellent moisture resistance and heat resistance and improved connection reliability.

The hydrogenated bisphenol A epoxy monomer or the hydrogenated bisphenol A epoxy oligomer may be present in an amount of about 1 to about 50 parts by weight, e.g., about 5 to about 30 parts by weight, based on 100 parts by weight of the anisotropic conductive film in terms of solid content. Within this range, the anisotropic conductive film may exhibit hard properties as well as excellent moisture resistance and heat resistance.

(c) Sulfonium Cation Curing Catalyst

The sulfonium cation curing catalyst may include any suitable sulfonium cation curing catalyst, without being particularly limited.

In an implementation, the sulfonium cation curing catalyst may include, e.g., sulfonium borate. Sulfonium borate may help reduce and/or prevent a large amount of fluorine ions from being emitted in polymerization of cations, thereby helping to reduce and/or prevent corrosion of a metal wiring or connection pad.

Any suitable sulfonium borate may be used, without being particularly limited. In an implementation, the sulfonium borate may include, e.g., aromatic sulfonium salts. In an implementation, the sulfonium borate may include, e.g., aromatic sulfonium salts represented by the following Formula 1 in view of achieving sufficient rapid low-temperature curing of the film (due to high efficiency in generating cations by thermal activation energy).

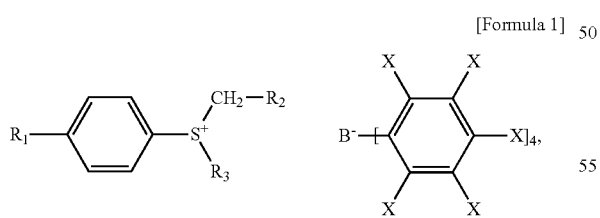

[Formula 1]

In Formula 1, $R_1$ may be selected from the group of hydrogen, a methyl group, an ethyl group,

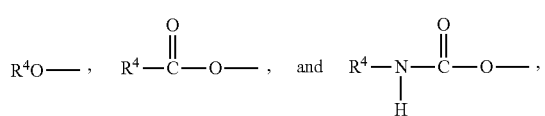

$R^4$ being selected from the group of an aromatic hydrocarbon, a substituted aromatic hydrocarbon, an aliphatic hydrocarbon, a substituted aliphatic hydrocarbon, a carboxyl group, and a sulfonyl group. $R_2$ may be selected from the group of toluene, phenol, benzene, o-xylene, and substituted or unsubstituted naphthalene. $R_3$ may be selected from the group of a methyl group, an ethyl group, a propyl group, and a butyl group. X may be fluorine.

In an implementation, $R_2$ may include, e.g., methylnaphthalene or dimethylnaphthalene.

One example of the sulfonium borate represented by Formula 1 may include a compound represented by the following formula.

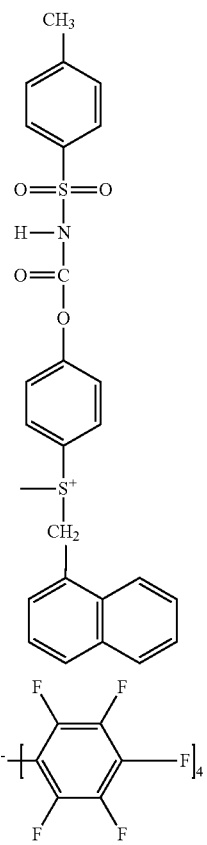

The sulfonium cation curing catalyst may be present in an amount of about 0.1 to about 10 parts by weight, e.g., about 1 to about 10 parts by weight, based on 100 parts by weight of the anisotropic conductive film in terms of solid content. Within this range, the anisotropic conductive film may realize sufficient rapid low-temperature curing and undesirable curing at room temperature or less may be reduced and/or prevented.

The anisotropic conductive film according to an embodiment may further include, e.g., a binder resin and/or conductive particles, in addition to the components (a), (b), and (c).

Binder Resin

The binder resin may include any suitable binder resin, without being particularly limited.

Examples of the binder resin may include a polyimide resin, a polyamide resin, a phenoxy resin, an epoxy resin, a polymethacrylate resin, a polyacrylate resin, a polyurethane resin, an acrylate modified urethane resin, a polyester resin, a polyester urethane resin, a polyvinyl butyral resin, a styrene-butylene-styrene (SBS) resin and epoxy modifications thereof, a styrene-ethylene-butylene-styrene (SEBS) resin and modifications thereof, and acrylonitrile butadiene rubber (NBR) and hydrogenated compounds thereof, without being limited thereto. The binder resins may be used alone or in combination thereof.

In an implementation, the binder resin may include, e.g., a thermosetting epoxy resin. In an implementation, the thermosetting epoxy resin may include e.g., an epoxy resin having a weight average molecular weight of about 20,000 g/mol or more and at least two epoxy groups.

The thermosetting epoxy resin may include at least one selected from the group of bisphenol, novolac, glycidyl, aliphatic, alicyclic, and aromatic epoxy resins, without being limited thereto. In an implementation, an epoxy resin having a solid phase at room temperature and an epoxy resin having a liquid phase at room temperature may be used in combination, and a flexible epoxy resin may be further added to the combination.

Examples of the epoxy resin having a solid phase at room temperature may include a phenol novolac epoxy resin, a cresol novolac epoxy resin, an epoxy resin having a dicyclopentadiene backbone, a bisphenol A or F polymer, and a modified epoxy resin, without being limited thereto. Examples of the epoxy resin having a liquid phase at room temperature may include bisphenol A, F, or mixed epoxy resins, without being limited thereto.

Examples of the flexible epoxy resin may include a dimer acid modified epoxy resin, an epoxy resin having a propylene glycol backbone, and a urethane modified epoxy resin. The aromatic epoxy resin may include at least one selected from the group of naphthalene, anthracene, and pyrene resins, without being limited thereto.

In an implementation, a fluorene epoxy resin may be used as the binder resin. When the binder resin includes a fluorene epoxy resin, the film may have a high glass transition temperature.

The binder resin may have a high weight average molecular weight (in view of ease of film formation) without being particularly limited. In an implementation, the binder resin may have a weight average molecular weight of about 5,000 to about 150,000 g/mol, e.g., about 10,000 to about 80,000 g/mol. Within this range, the binder resin may have excellent compatibility with other components of the film composition and may facilitate film formation.

The binder resin may be present in an amount of about 20 to about 60 parts by weight, e.g., about 30 to about 50 parts by weight, based on 100 parts by weight of the anisotropic conductive film in terms of solid content. Within this range, film formation may be facilitated.

Conductive Particles

The conductive particles may include any suitable conductive particles, without being particularly limited.

Example of the conductive particles may include metal particles, e.g., Au, Ag, Ni, Cu, and solder particles; carbon particles; metal-coated resin particles, e.g., particles of polyethylene, polypropylene, polyester, polystyrene, polyvinyl alcohol and modified resins thereof coated with Au, Ag, Ni, and the like; and conductive particles insulated by further coating with insulation particles.

A particle size of the conductive particles may be about 2 to about 30 µm, depending on a pitch of circuits to be used and purposes.

The conductive particles may be present in an amount of about 0.1 to about 30 parts by weight, based on 100 parts by weight of the anisotropic conductive film in terms of solid content. Within this range, undesirable misalignment of terminals (which may be caused by an excessively small amount of conductive particles during connection) may be reduced and/or prevented to avoid a bad connection, and undesirable poor insulation (due to an excessive amount of conductive particles) may also be reduced and/or prevented.

Another embodiment provides a semiconductor device bonded by an anisotropic conductive film including a reactive monomer having an epoxy equivalent weight of about 120 to about 180 g/eq and a sulfonium cation curing catalyst. For example, the anisotropic conductive film may be a rapid low-temperature curable anisotropic conductive film having a curing rate of about 80% or more when cured at 150 to 170° C. for 5 seconds.

Curing rate may be calculated by the following equation using heating values measured with differential scanning calorimetry (DSC):

$$\text{Curing rate} = \{(Q_0 - Q_T)/Q_0\} \times 100$$

In the above, formula, $Q_0$ is a heating value before curing, and $Q_T$ is a heating value after curing.

The anisotropic conductive film may further include an aromatic or hydrogenated epoxy resin, e.g., a hydrogenated epoxy resin. A hydrogenated epoxy resin may have higher reactivity with the sulfonium cation curing catalyst than an aromatic epoxy resin, thereby favorably achieving sufficient rapid low-temperature curing.

There is no particular restriction as to a method of forming an anisotropic conductive film according to an embodiment, and any suitable method may be employed.

A special apparatus or facility may not be required in a method of forming an anisotropic conductive film. For example, an anisotropic conductive film may be produced by the following procedure: a binder resin may be dissolved and liquefied in an organic solvent; remaining components may be added to the solution and stirred for a certain period of time; and the mixture may be applied to a release film to an appropriate thickness, e.g., about 10 to about 50 µm, and dried for a certain period of time to volatilize the organic solvent.

The embodiments provide a semiconductor device bonded with the ACF. For example, the semiconductor device may include a wiring substrate, an anisotropic conductive film attached to a chip mounting surface of the wiring substrate, and a semiconductor chip mounted on the film.

There is no particular restriction as to a wiring substrate and a semiconductor chip to be used in the embodiments, and any suitable wiring substrate and semiconductor chip may be employed.

There is no particular restriction as to the method of manufacturing a semiconductor device according to an embodiment, and any suitable method may be used.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Example 1

1. Preparation of Anisotropic Conductive Film Composition

Based on 100 parts by weight of an anisotropic conductive film composition, 5 parts by weight of an epoxy reactive monomer (epoxy equivalent weight: 145 g/eq, EX-711, Nagase ChemteX); 30 parts by weight of a hydrogenated epoxy resin (epoxy equivalent weight: 225 g/eq, ST-3000, Kukdo Chemical Co., Ltd.); and 45 parts by weight of a binder resin (phenoxy resin, YP-50, Tohto Kasei Co., Ltd.) were mixed with solvent, and then 5 parts by weight of a sulfonium curing catalyst represented by the following Formula 1-1 was added to the mixture.

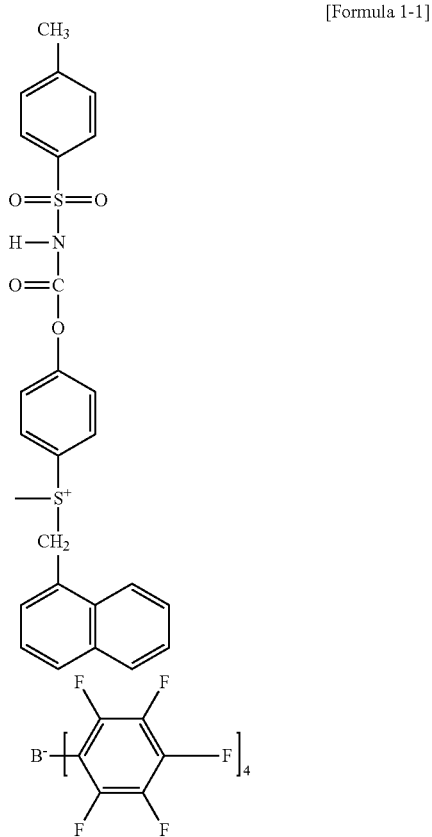

[Formula 1-1]

Then, 10 parts by weight of conductive particles was added to the prepared insulating adhesive, and 5 parts by weight of toluene was added thereto and stirred for 40 minutes so as to uniformly disperse the conductive particles, thereby preparing an anisotropic conductive film composition.

After removing bubbles during stirring, the composition was evaluated as to viscosity using a rotational viscometer at a shear rate ($\gamma$) of 5~20 μm/sec. The viscosity was in the range from about 10,000 cP to about 30,000 cP.

2. Preparation and Evaluation of Anisotropic Conductive Film

The anisotropic conductive film composition was applied to a silicone release base polyethylene terephthalate (PET) film using a comma coater and dried at three zones from 60 to 80° C. for 10 minutes, thereby producing an anisotropic conductive film having a thickness of 25 μm.

The anisotropic conductive film was heat-pressed and then slit into 1.5 mm-wide pieces (for evaluation of a curing rate and adhesive strength), which were subjected to preliminary pressing on glass formed with an indium tin oxide (ITO) electrode at 70° C. and 0.1 MPa for 1 second.

Then, after separating the silicone release base PET film, bumps of a driver IC were arranged on the anisotropic conductive film, followed by final pressing at 150° C. and 70 MPa for 5 seconds.

The composition of the anisotropic conductive film is shown in Table 1, below.

Example 2

An anisotropic conductive film was prepared in the same manner as in Example 1 except that the epoxy reactive monomer content was increased from 5 parts by weight to 7 parts by weight and the binder resin content was reduced from 45 parts by weight to 43 parts by weight.

The composition of the anisotropic conductive film is shown in Table 1.

Example 3

An anisotropic conductive film was prepared in the same manner as in Example 1 except that the hydrogenated epoxy resin content was increased from 30 parts by weight to 45 parts by weight and the binder resin content was reduced from 45 parts by weight to 30 parts by weight.

The composition of the anisotropic conductive film is shown in Table 1.

Comparative Example 1

An anisotropic conductive film was prepared in the same manner as in Example 1 except that the epoxy reactive monomer was replaced by epoxy having an equivalent weight of 184~190 g/eq (YD-128, Tohto Kasei Co., Ltd.).

The composition of the anisotropic conductive film is shown in Table 1.

Comparative Example 2

An anisotropic conductive film was prepared in the same manner as in Example 1 except that the epoxy reactive monomer was not used and the hydrogenated epoxy resin content was increased from 30 parts by weight to 35 parts by weight.

The composition of the anisotropic conductive film is shown in Table 1.

TABLE 1

| Component | Example 1 | Example 2 | Example 3 | Comparative Example 1 | Comparative Example 2 |
|---|---|---|---|---|---|
| Epoxy monomer | 5 | 7 | 5 | 5 | — |
| Hydrogenated epoxy resin | 30 | 30 | 45 | 30 | 35 |
| Binder resin | 45 | 43 | 30 | 45 | 45 |
| Sulfonium curing agent | 5 | 5 | 5 | 5 | 5 |
| Conductive particles | 10 | 10 | 10 | 10 | 10 |
| Toluene | 5 | 5 | 5 | 5 | 5 |
| Total | 100 | 100 | 100 | 100 | 100 |

Experimental Example 1

Evaluation of Adhesive Strength

The anisotropic conductive films according to Examples 1 to 3 and Comparative Examples 1 and 2 were evaluated as to adhesive strength as follows.

Each of the anisotropic conductive films was slit into 1.5 mm-wide pieces, which were subjected to preliminary pressing on glass formed with an ITO electrode at 70° C. and 0.1 MPa for 1 second. Then, bumps of a driver IC were arranged on the anisotropic conductive film, followed by final pressing in a temperature range of 150° C. to 170° C. at 70 MPa for 5 seconds.

In this manner, five specimens of each film were prepared and evaluated as to strength when the driver IC was separated at a shear rate of 100 μm/sec using a die shear tester (Dage 4000 series, Dage) to calculate adhesive strength. The results are shown in Table 2, below.

Experimental Example 2

Evaluation of Curing Rate

To evaluate the curing rate of each of the anisotropic conductive films according to Examples 1 to 3 and Comparative Examples 1 and 2 at 150° C., a driver IC was pressed on glass formed with an ITO electrode at 150° C. and 70 MPa for 5 seconds and then separated. Then, a heating value of the remaining anisotropic conductive film was measured (at 10° C./min from 0 to 300° C.) using DSC (TA Instruments Q series), and a heating value of the anisotropic conductive film before curing was calculated, followed by calculation of curing rate using the following equation:

Curing rate=$\{(Q_0-Q_T)/Q_0\} \times 100$

In the above equation, $Q_0$ is a heating value before curing, and $Q_T$ is a heating value after curing.

Experimental Example 3

Evaluation of Connection Resistance

To evaluate the connection resistance of each of the anisotropic conductive films according to Examples 1 to 3 and Comparative Examples 1 and 2, each film was attached to a driver IC (pitch: 16 μm, bump area: 1,000 μm, bump height: 12 μm) and to glass patterned with an ITO electrode (pitch: 16 μm, electrode width: 10 μm) under the following conditions.

1) Preliminary pressing: 70° C., 1 second, 0.1 MPa

2) Final pressing: 150° C., 5 seconds, 7.0 MPa

Five specimens of each film attached as above were prepared and evaluated as to initial connection resistance using a 4-terminal measurement method (in accordance with ASTM F43-64T), followed by calculation of an average value.

Results of Experimental Examples 1 to 3 are provided in Table 2.

TABLE 2

| | Example 1 | Example 2 | Example 3 | Comparative Example 1 | Comparative Example 2 |
|---|---|---|---|---|---|
| Curing rate (%) | 80 | 90 | 82 | 60 | 50 |
| Adhesive strength (MPa) | 25 | 30 | 25 | 5 | 4 |
| Connection resistance (Ω) | 0.2 | 0.1 | 0.2 | 10 | 15 |

As may be seen in Table 2, the anisotropic conductive films of Examples 1-3 exhibited higher curing rates, higher adhesive strengths, and lower connection resistances, than the anisotropic conductive films of Comparative Examples 1 and 2.

By way of summation and review, anisotropic conductive adhesive bonding using an anisotropic conductive film has been used to bond electronic components, semiconductor elements, or connection terminals of a substrate. Such anisotropic conductive adhesive bonding may be generally used in manufacturing a panel of a flat panel display to bond a tape carrier process (TCP) terminal and a transparent electrode of a glass substrate, to bond a driver IC and a flexible printed circuit board (FPCB) terminal, or to bond a driver IC and a transparent electrode. For example, the application of anisotropic conductive adhesive bonding to packaging may replace solder ball bonding in flip-chip packaging.

When an anisotropic conductive film is used to bond a driver IC and a transparent electrode, bonding at high temperature may cause severe warpage during curing by heat after bonding, due to differences in coefficients of thermal expansion between a silicone wafer forming the driver IC and glass on which the transparent electrode is formed, thereby resulting in substandard products. Accordingly, a rapid low-temperature curable anisotropic conductive film, which is cured at low temperature in a short time, may be desirable.

A heat-curable epoxy resin composition may include a general epoxy resin and a sulfonium salt compound, wherein the epoxy resin and the sulfonium curing catalyst are used together. However, the heat-curable epoxy resin includes a sulfonium curing catalyst having a particular substituent to have high glass transition temperature. Therefore, the heat-curable epoxy resin may not be suitable as a rapid low-temperature curable anisotropic conductive film.

A photo-curable composition may include an epoxy resin and a cation photoinitiator, in which the epoxy resin and the cation curing agent are used together. Such a photo-curable composition may further include a photosensitizer to detect or react in response to light and thus is cured by light. The photo-curable composition may not be adequate for use as a rapid low-temperature curable anisotropic conductive film composition.

The anisotropic conductive film according to an embodiment may be rapidly cured at low temperature, and serious warpage thereof during heat curing may be reduced and/or prevented.

The embodiments provide an anisotropic conductive film, e.g., a rapid low-temperature curable anisotropic conductive film, which may be rapidly cured at low temperature, and thus serious warpage during heat curing may be reduced and/or prevented.

The embodiments provide an anisotropic conductive film that employs a reactive monomer having a particular epoxy equivalent weight to achieve rapid low-temperature curing.

The embodiments provide an anisotropic conductive film that uses, e.g., sulfonium borate, as a sulfonium cation curing catalyst to help reduce and/or prevent emission of large amounts of fluorine ions in polymerization of cations.

The embodiments provide an anisotropic conductive film that further includes a hydrogenated epoxy resin to help enhance reaction efficiency with a sulfonium cation curing catalyst, thereby exhibiting excellent rapid low-temperature curing properties.

The embodiments provide a rapid low-temperature curable anisotropic conductive film that may be rapidly cured at low temperature.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope of the present invention as set forth in the following claims.

What is claimed is:

1. A display device bonded by an anisotropic conductive film, the anisotropic conductive film comprising:
   about 1 to about 20 parts by weight of a reactive monomer having an epoxy equivalent weight of about 120 to about 180 g/eq;
   about 5 to about 50 parts by weight of a hydrogenated epoxy resin; and
   about 0.1 to about 10 parts by weight of a sulfonium cation thermal curing catalyst, all parts by weight being based on 100 parts by weight of the anisotropic conductive film in terms of solid content,
   wherein the anisotropic conductive film has a curing rate of about 80% or more when cured at 150 to 170° C. for 5 seconds.

2. The display device as claimed in claim 1, wherein the anisotropic conductive film further includes a binder resin and conductive particles.

3. The display device as claimed in claim 2, wherein the binder resin includes at least one selected from the group of a polyimide resin, a polyamide resin, a phenoxy resin, an epoxy resin, a polymethacrylate resin, a polyacrylate resin, a polyurethane resin, an acrylate modified urethane resin, a polyester resin, a polyester urethane resin, a polyvinyl butyral resin, a styrene-butylene-styrene resin and epoxy modifications thereof, a styrene-ethylene-butylene-styrene resin and modifications thereof, and acrylonitrile butadiene rubber and hydrogenated compounds thereof.

4. The display device according as claimed in claim 1, wherein the hydrogenated epoxy resin has an epoxy equivalent weight of about 150 to about 1,300 g/eq.

5. The display device according as claimed in claim 1, wherein the hydrogenated epoxy resin includes a hydrogenated bisphenol A epoxy resin.

6. The display device as claimed in claim 5, wherein the hydrogenated bisphenol A epoxy resin includes at least one selected from the group of a hydrogenated bisphenol A epoxy monomer represented by Formula 2, below, or a hydrogenated bisphenol A epoxy oligomer represented by Formula 3, below,

[Formula 2]

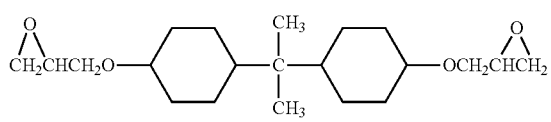

[Formula 3]

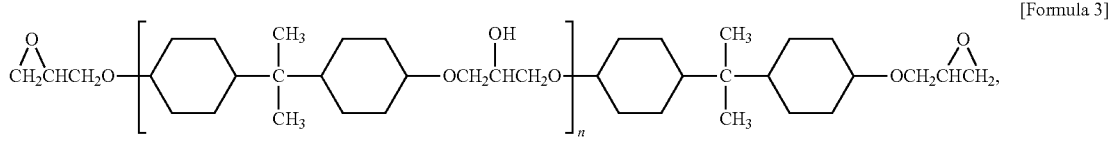

wherein, in Formula 3, n is an integer of about 1 to about 13.

7. The display device as claimed in claim 1, wherein the reactive monomer includes at least one selected from the group of a reactive monomer having at least two glycidyl groups, a reactive monomer having a monoaromatic structure, and a reactive monomer having an alicyclic structure.

8. The display device as claimed in claim 7, wherein the reactive monomer includes at least one selected from the group of resorcinol diglycidyl ether, 1,4-cyclohexane dimethanol diglycidyl ether, dicyclopentadiene dioxide, 2-((4-(2-oxiranylmethoxy)phenoxy)methyl)oxirane, diglycidyl 1,2-cyclohexanedicarboxylate, diglycidyl terephthalate, and diglycidyl o-phthalate.

9. The display device as claimed in claim 1, wherein the sulfonium cation thermal curing catalyst includes sulfonium borate.

10. The display device as claimed in claim 9, wherein the sulfonium borate includes a compound represented by Formula 1:

[Formula 1]

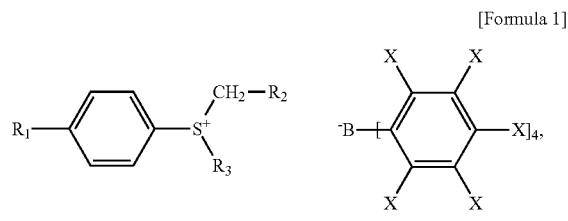

wherein:
R₁ is selected from the group of hydrogen, a methyl group, an ethyl group,

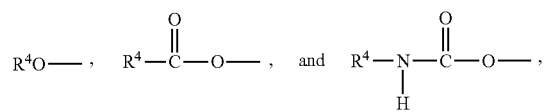

R⁴ being selected from the group of an aromatic hydrocarbon, a substituted aromatic hydrocarbon, an aliphatic hydrocarbon, a substituted aliphatic hydrocarbon, a carboxyl group, and a sulfonyl group;
R₂ is selected from the group of toluene, phenol, benzene, o-xylene, and substituted or unsubstituted naphthalene;
R₃ is selected from the group of a methyl group, an ethyl group, a propyl group, and a butyl group; and
X is fluorine.

11. The display device as claimed in claim 10, wherein R₂ is methylnaphthalene or dimethylnaphthalene.

12. A display device bonded by a rapid low-temperature curable anisotropic conductive film, the rapid low-temperature curable anisotropic conductive film comprising:
about 1 to about 20 parts by weight of a reactive monomer having an epoxy equivalent weight of about 120 to about 180 g/eq,
about 5 to about 50 parts by weight of a hydrogenated epoxy resin;
about 5 to about 50 parts by weight of a sulfonium cation thermal curing catalyst;
about 20 to about 60 parts by weight of a binder resin; and
about 0.1 to about 30 parts by weight of conductive particles, all parts by weight being based on 100 parts by weight of the rapid low-temperature curable anisotropic conductive film in terms of solid content,
wherein the rapid low-temperature curable anisotropic conductive film has a curing rate of about 80% or more when cured at 150 to 170° C. for 5 seconds.

13. The display device as claimed in claim 12, wherein the reactive monomer includes at least one selected from the group of a reactive monomer having at least two glycidyl groups, a reactive monomer having a monoaromatic structure, and a reactive monomer having an alicyclic structure.

14. The display device as claimed in claim 12, wherein the reactive monomer includes at least one selected from the group of resorcinol diglycidyl ether, 1,4-cyclohexane dimethanol diglycidyl ether, dicyclopentadiene dioxide, 2-((4-(2-oxiranylmethoxy)phenoxy)methyl)oxirane, diglycidyl 1,2-cyclohexanedicarboxylate, diglycidyl terephthalate, and diglycidyl o-phthalate.

15. A display device bonded by an anisotropic conductive film, the anisotropic conductive film comprising:
about 1 to about 20 parts by weight of a reactive monomer having an epoxy equivalent weight of about 120 to about 180 g/eq;
about 5 to about 50 parts by weight of a hydrogenated bisphenol A epoxy resin; and
about 0.1 to about 10 parts by weight of a sulfonium cation curing catalyst, all parts by weight being based on 100 parts by weight of the anisotropic conductive film in terms of solid content,
wherein the anisotropic conductive film has a curing rate of about 80% or more when cured at 150 to 170° C. for 5 seconds.

16. The display device as claimed in claim 15, wherein the hydrogenated bisphenol A epoxy resin includes at least one selected from the group of a hydrogenated bisphenol A epoxy monomer represented by Formula 2, below, or a hydrogenated bisphenol A epoxy oligomer represented by Formula 3, below,

[Formula 2]

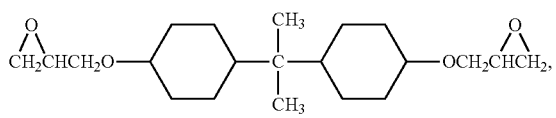

-continued
[Formula 3]
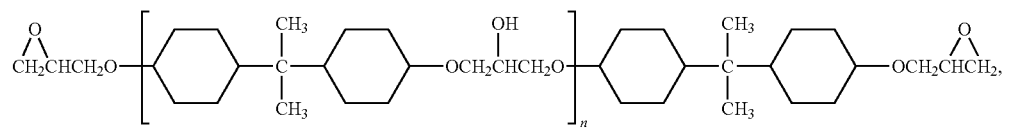
wherein, in Formula 3, n is an integer of about 1 to about 13.